United States Patent [19]
Karniewicz et al.

[11] Patent Number: 5,739,058
[45] Date of Patent: Apr. 14, 1998

[54] METHOD TO CONTROL THRESHOLD VOLTAGE BY MODIFYING IMPLANT DOSAGE USING VARIABLE APERTURE DOPANT IMPLANTS

[75] Inventors: Joe Karniewicz, Boise; Zhiqiang (Jefferey) Wu, Meridian; Chandramouli Venkataramani, Boise; David Kao, Meridian; Mohamed Imam; Sittampalam Yoganathan, both of Boise, all of Id.

[73] Assignee: Micron Technology, Inc.

[21] Appl. No.: 572,020

[22] Filed: Dec. 14, 1995

[51] Int. Cl.⁶ .................................. H01L 21/8238
[52] U.S. Cl. .......................... 438/217; 438/291; 438/525; 438/529; 438/531; 438/944; 257/392
[58] Field of Search .................... 437/34, 35, 45, 437/56, 57, 58, 36; 257/391, 392

[56] References Cited

U.S. PATENT DOCUMENTS

| | | | |
|---|---|---|---|
| 4,257,826 | 3/1981 | Matalone et al. | |
| 4,329,186 | 5/1982 | Kotecha et al. | 257/392 |
| 4,745,083 | 5/1988 | Huie | 437/45 |
| 4,893,164 | 1/1990 | Shirato | 257/392 |
| 5,075,242 | 12/1991 | Nakahara | 437/45 |
| 5,091,324 | 2/1992 | Hsu et al. | 437/45 |
| 5,210,437 | 5/1993 | Sawada et al. | 257/392 |
| 5,278,078 | 1/1994 | Kanebako et al. | 437/45 |
| 5,407,849 | 4/1995 | Khambaty et al. | 437/45 |
| 5,416,038 | 5/1995 | Hsue et al. | 437/34 |

FOREIGN PATENT DOCUMENTS

| | | |
|---|---|---|
| 62-248222 | 10/1987 | Japan. |
| 1-99252 | 4/1989 | Japan. |
| 228602 | 8/1994 | Taiwan. |

OTHER PUBLICATIONS

S. Wolf & R.N. Tauber, "Silicon Processing for the VLSI Era" vol. I, p. 264, Aug. 1990.

*Primary Examiner*—Charles L. Bowers, Jr.
*Assistant Examiner*—Leon Radomsky
*Attorney, Agent, or Firm*—Reed Smith Shaw & McClay

[57] ABSTRACT

A semiconductor fabrication method is provided for forming transistors upon a semiconductor substrate wherein the semiconductor substrate has first, second and third substrate regions. A single mask layer is formed over the semiconductor substrate. The single mask layer has a first mask portion covering the first substrate region, a second mask portion exposing the second substrate region, and a third mask portion partially covering the third substrate region. A first type impurity dopant is differentially introduced into the first, second and third substrate regions according to the single mask layer. First, second and third transistors are formed in the first, second and third substrate regions, respectively. The first and second transistors have differing conductivity types and the first and third transistors have the same conductivity type. The first and third transistors also have differing threshold voltages according to the differential introducing of the dopant. A first type impurity dopant is introduced into the third substrate region at a selectable angle and the amount of dopant introduced in the third substrate region varies according to the percentage of the third substrate region covered by the third mask portion and the selectable angle.

11 Claims, 6 Drawing Sheets

METHOD TO CONTROL THRESHOLD VOLTAGE BY MODIFYING IMPLANT DOSAGE USING VARIABLE APERTURE DOPANT IMPLANTS

BACKGROUND OF THE INVENTION

1. Field of the Invention

This invention relates to the field of semiconductor integrated circuit fabrication technology, and, in particular, to determining the threshold voltage of transistors by controlling dopant implantation in integrated circuit fabrication.

2. Background Art

An electronic circuit can be chemically and physically integrated into a semiconductor substrate, such as a silicon wafer, by patterning regions in the substrate and patterning layers on the substrate. The regions and layers on the substrate can have variable resistivity, thereby permitting the fabrication of conductors and resistors. They can also have different conductivity types. This permits the fabrication of transistors and diodes. The amount of capacitance within integrated circuits is also controllable, as well as the physical dimensions and locations of the regions and layers on the substrate. These features make integration of electronic circuits possible.

The semiconductor material of integrated circuits can be implanted with various impurities in order to control conductivity type. For example, when silicon is doped with atoms having more than four valence electrons, Group V or higher in the periodic table, negatively charged majority carriers are introduced into the silicon. These atoms include arsenic and phosphorus. Silicon doped in this manner is referred to as n-type silicon. When the silicon is doped with impurities having less than four valence electrons, Group III or lower, such as boron, positively charged majority carriers are introduced into the silicon. Silicon doped in this manner is referred to as p-type silicon. Semiconductor materials other than silicon can also be doped in this manner in order to provide n-type and p-type material. The majority carrier type of semiconductor material is also referred to as its conductivity type.

Figure 1:
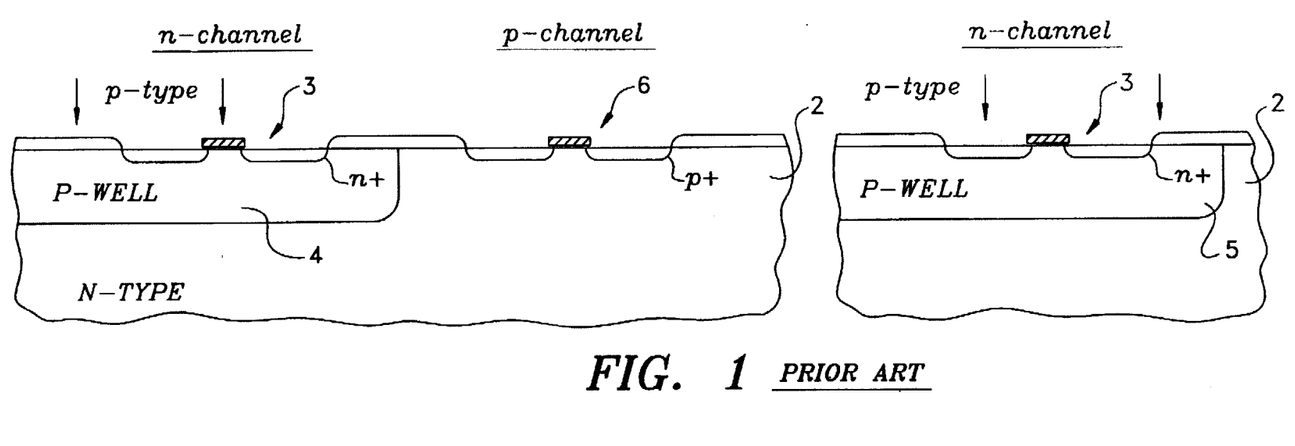
FIG. 1 shows a cross-sectional representation of a prior art semiconductor integrated circuit device wherein both n-channel and p-channel transistors can be formed on the same n-type substrate using the introduction of p-type donor impurities to overcompensate the n-type substrate in selected areas.
Figures 3, 4A, 4B:
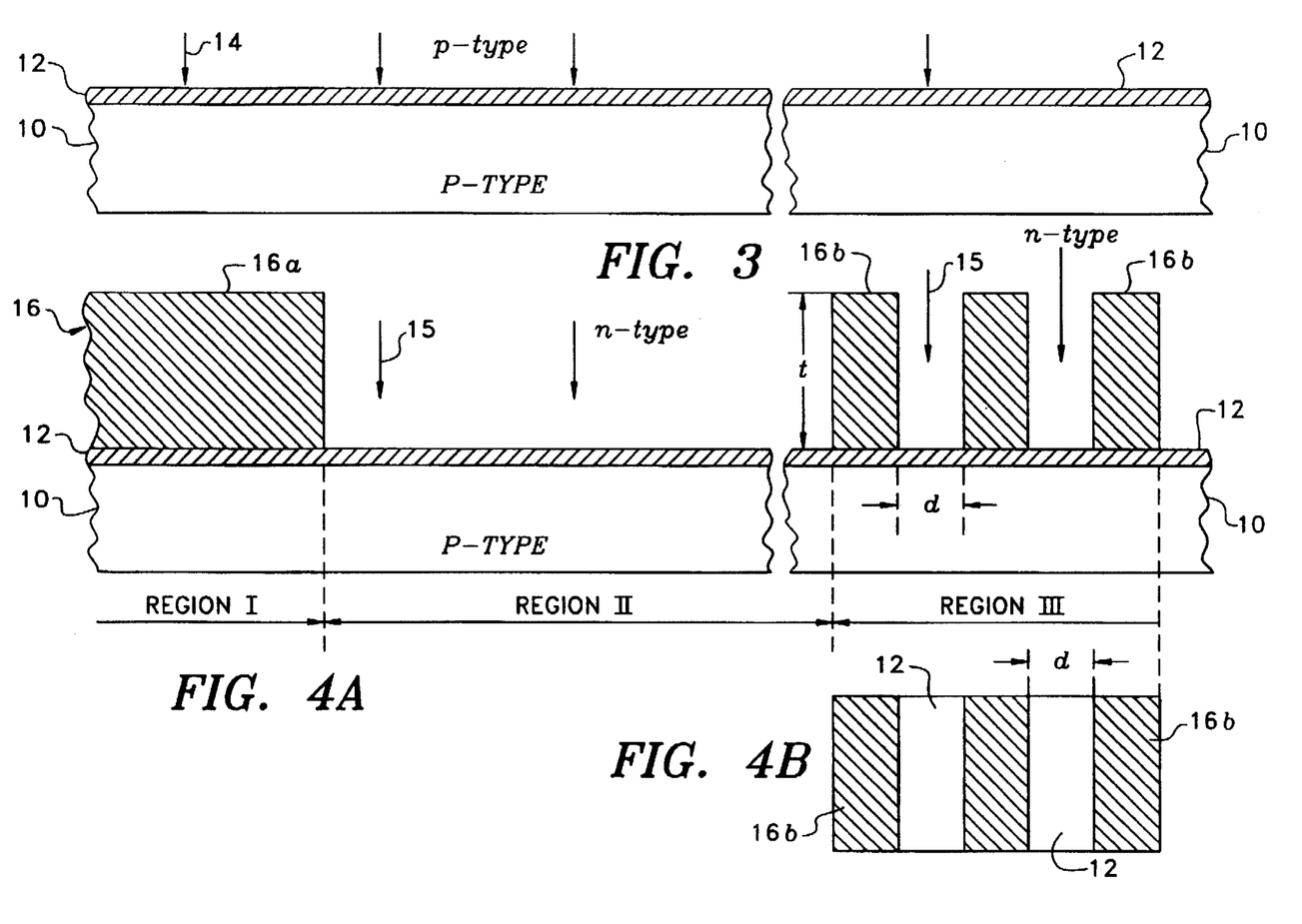
FIG. 3 shows a cross-sectional representation of the method of the present invention for forming both n-channel and p-channel transistors on a single substrate wherein the substrate receives a blanket dopant implant.
FIG. 4A shows a cross-sectional representation of the method of the present invention for forming both n-channel and p-channel transistors on a single substrate, including a mask according to the present invention.
FIG. 4B shows a plan view of a portion of the mask of FIG. 4A.

Referring now to FIG. 1, there is shown a cross-sectional representation of an intermediate step in a prior art p-well process wherein p-wells 4, 5 are formed within n-type semiconductor substrate 2. It is well known in the art of integrated circuit fabrication to form MOSFET transistors using p-type and n-type semiconductor material. In particular it is known in the art of semiconductor fabrication to form n-channel transistors 3 in p-wells such as p-wells 4, 5, and to form p-channel transistor 6 in n-type substrates, such as n-type substrate 2. As will be better understood from the illustration of FIG. 4, while p-wells 4, 5 can be disposed on different areas of semiconductor substrate 2, they can be fabricated simultaneously.

The prior art process represented in FIG. 1 involves implanting or diffusing p-type dopants into n-type substrate 2. Enough dopant is introduced to provide a concentration that is high enough to overcompensate the n-type dopants in substrate 2 in order to form p-wells 4, 5. In order to obtain this result the concentration of the p-type doping of p-wells 4, 5 must typically be five to ten times higher than the concentration of n-type doping in n-type semiconductor substrate 2. However, the concentration of p-type dopant implanted or diffused into n-type substrate 2 must be sufficient to provide the required electrical characteristics of n-channel transistors 3. Excessive p-well doping of semiconductor substrate 2 to form p-wells 4, 5 can produce deleterious effects in n-channel transistors 3 formed within p-wells 4, 5. These deleterious effects can include increased back gate bias effects, reduction in mobility and increased source or drain to p-well capacitance.

The threshold voltage of a MOSFET transistor device is a function of the doping in the transistor channel under its gate. Thus, by selectively altering the dopant profile under a gate, it is possible to alter the threshold voltage of the transistor device. The availability of transistor devices with different threshold voltages on the same integrated circuit wafer gives circuit designers greater design flexibility. Typically, in a CMOS process, a predetermined amount of p-type impurities or n-type impurities is implanted under the transistor gates after formation of the wells in the substrate. This permits varying of the profiles of dopants in the channels. The ability to vary the channel profile permits varying of the threshold voltage of the transistor devices. But the fabrication process is costly if devices with different threshold voltages are provided because each set of devices having a different threshold voltage requires its own separate mask level for a selective implantation.

Figure 2:
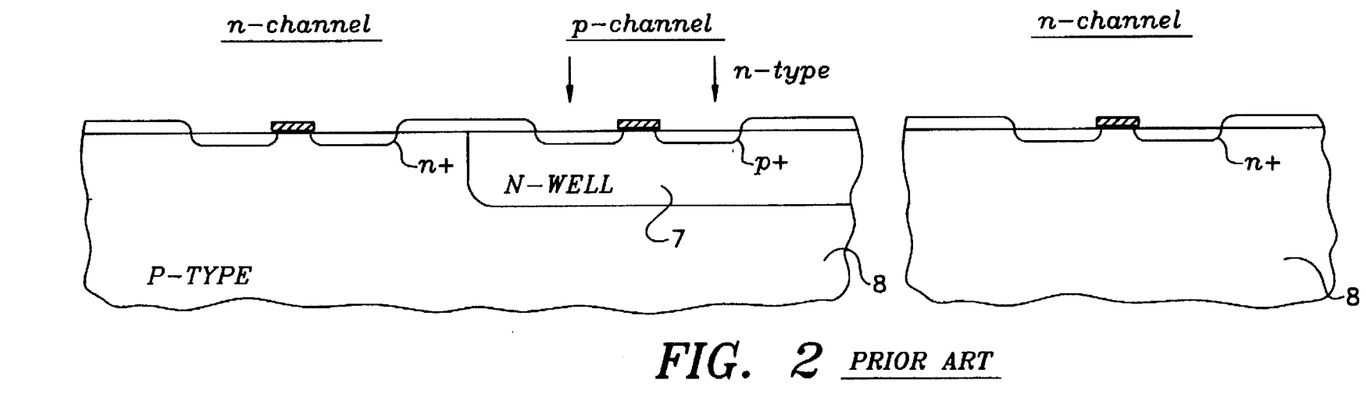
FIG. 2 shows a cross-sectional representation of a prior art semiconductor integrated circuit device wherein both n-channel and p-channel transistors can be formed on the same p-type substrate using the introduction of n-type donor impurities to overcompensate the p-type substrate in selected areas.

Two alternate approaches to the p-well semiconductor fabrication process of FIG. 1 are known. They are the n-well fabrication process and the twin well fabrication process. The n-well process is shown in FIG. 2. In the n-well process an n-well 7 is formed in p-type semiconductor substrate 8. In the n-well fabrication process, the impurity doping of n-well 7 must overcompensate the impurity doping of p-type semiconductor substrate 8. Therefore, the p-channel transistor formed therein can suffer from excessive doping effects.

In the twin well semiconductor fabrication process, two separate wells having different conductivity types are implanted into a very lightly doped semiconductor substrate. The semiconductor substrate can be formed of silicon. The doping profiles in each of the separate wells can be adjusted independently so that neither conductivity type device suffers from excessive doping effects. If the semiconductor substrate is formed of silicon, the lightly doped silicon in which well formation takes place can be an epitaxial layer grown on a heavily doped silicon substrate. The substrate can be either n-type or p-type.

However in each of the alternate approaches set forth hereinabove, an additional mask level is required in order to provide FET transistors having different threshold voltages on the same semiconductor substrate.

It is therefore an object of the present invention to provide a process for forming MOSFET transistors upon a semiconductor substrate.

It is a further object of the present invention to permit the threshold voltage of the transistors to be adjusted by variably implanting donor impurities into the semiconductor substrate.

It is a further object of the present invention to permit the formation of transistors having differing threshold voltages on the same die or semiconductor substrate.

It is a further object of the present invention to permit the fabrication of transistors having different threshold voltages on the same semiconductor substrate without any increase in the number of mask levels.

These and other objects and advantages of the present invention will become more fully apparent from the description and claims which follow or may be learned by the practice of the invention.

SUMMARY OF THE INVENTION

A semiconductor fabrication method is provided for forming transistors upon a semiconductor substrate wherein the semiconductor substrate has first, second and third substrate regions. A single mask layer is formed over the semiconductor substrate. The single mask layer has a first mask portion covering the first substrate region, a second mask portion exposing the second substrate region, and a third mask portion partially covering the third substrate region. A first type impurity dopant is differentially introduced into the first, second and third substrate regions according to the single mask layer. First, second and third transistors are formed in the first, second and third substrate regions, respectively. The first and second transistors have differing conductivity types and the first and third transistors have the same conductivity type. The first and third transistors also have differing threshold voltages according to the differential introducing of the dopant. A first type impurity dopant is introduced into the third substrate region at a selectable angle and the amount of dopant introduced in the third substrate region varies according to the percentage of the third substrate region covered by the third mask portion and the selectable angle.

BRIEF DESCRIPTION OF THE DRAWINGS

In order that the manner in which the above recited and other advantages and objects of the invention are obtained can be appreciated, a more particular description of the invention briefly described above is rendered by reference to a specific embodiment thereof which is illustrated in the appended drawings. Understanding that these drawings depict only a typical embodiment of the invention and are therefore not to be considered limiting of its scope, the invention and the presently understood best mode thereof are described and explained with additional specificity and detail through the use of the accompanying drawings.

DETAILED DESCRIPTION OF THE INVENTION

Referring now to FIG. 3, there is shown a cross-sectional representation of p-type semiconductor substrate 10. In a preferred embodiment of the invention, p-type semiconductor substrate 10 can be formed of silicon. In the method of the present invention initial oxide layer 12 is formed over p-type semiconductor substrate 10. Initial oxide layer 12 can be a native oxide or a deposited oxide. It can have a thickness of approximately one-hundred fifty to two-hundred angstroms. A blanket p-well impurity implant of p-type semiconductor substrate 10 is performed, as indicated by implant arrows 14, in preparation for subsequent p-well formation. The blanket implant indicated by implant arrows 14 is performed in accordance with conventional fabrication techniques. The p-well impurity introduced by the blanket p-well implant of implant arrows 14 can be boron.

Referring now to FIG. 4A, n-well photoresist mask 16 is disposed over the surface of p-type semiconductor substrate 10 in order to perform lithography steps in accordance with the method of the present invention. In the lithography steps of the present invention, conventional photoresist technology is used to form a single n-well photoresist mask 16. N-well photoresist mask 16 formed this way is patterned to define three regions of semiconductor substrate 10: Region I, Region II and Region III. It will be understood by those skilled in the art that the regions defined in this manner by photoresist mask 16 can be located anywhere on semiconductor substrate 10 with respect to each other.

A solid portion of photoresist mask 16, shown as mask portion 16a, defines Region I of semiconductor substrate 10. Thus Region I is covered and protected from the introduction of impurity dopants by photoresist mask 16. Region II is an exposed area of semiconductor substrate 10, having no portions of photoresist mask 16 thereabove. Thus Region II is not protected from the introduction of impurity dopants by photoresist mask 16.

Region III is defined by masking that partially covers and partially exposes an area of semiconductor substrate 10, thereby defining apertures through which dopant material can pass. For example, Region III can be defined by strips of photoresist mask 16, shown as mask portions 16b, that alternately cover and expose areas of Region III. Mask portions 16b can have a dimension d and a height t. Typical values for the dimensions of mask portions 16b can be t=1.5 um, d=0.2 um. A top view of mask portions 16b is shown in FIG. 4B. As seen in FIG. 4B, mask portions 16b alternately cover and expose regions of oxide layer 12. Thus Region III is partially protected from impurity implantation by photoresist mask 16 and partially exposed to impurity implantation.

An implant of n-type donor impurities is performed into the exposed areas of p-type semiconductor substrate 10, as indicated by implant arrows 15. The direction of the n-well implant indicated by arrows 15 is substantially perpendicular to surface of semiconductor substrate 10. The n-well implant can be a shallow arsenic implant with a dose of $2e12/cm^2$ at 35 keV. This implant is thus a relatively low energy implant.

The n-type dopant implantation indicated by implant arrows 15 does not introduce any n-type dopant material into Region I because Region I is protected by mask portion 16a. Thus a p-well can later be formed in Region I because of the p-type dopant introduced to Region I by the implantation indicated by implant arrows 14.

Because Region II is not protected by photoresist mask 16, the n-type dopant implantation indicated by implant arrows 15 does introduce n-type dopant material into Region II. Enough n-type dopant material is introduced into Region II by this implant to overcompensate the p-type conductivity of semiconductor substrate 10 in Region II and later form an n-well.

The n-type dopant implantation indicated by implant arrows 15 also introduces n-type dopant material into Region III. However, the amount of dopant material introduced into Region III is less than the amount introduced into Region II because the implant is partially blocked by mask portions 16b. It will be understood that the amount of dopant material introduced in this manner is controlled according to the percentage of Region III exposed by photoresist mask 16.

The amount of dopant introduced into Region III by the implantation of arrows 15 can be controlled by adjusting the dimension d of mask portions 16b. For example, the amount of dopant can be controlled to permit the concentration of n-type dopant material to overcompensate the p-type conductivity of semiconductor substrate 10 in Region III. This would produce an n-well region, as previously described with respect to Region II. However, in the preferred embodiment of the invention, the amount of n-type dopant introduced into Region III of semiconductor substrate 10 is not enough to overcompensate the p-type dopant. Thus a p-well can be formed later in Region III.

It will be understood that the n-type material introduced into Region III by the implantation indicated by arrows 15 causes the p-well later formed in Region III to have a different concentration than the p-well later formed in Region I. Furthermore, it will be understood by those skilled in the art that the differing concentrations of the p-wells later formed in Region I and Region III permit transistors of differing threshold voltages to be built in the two regions.

Figure 5:
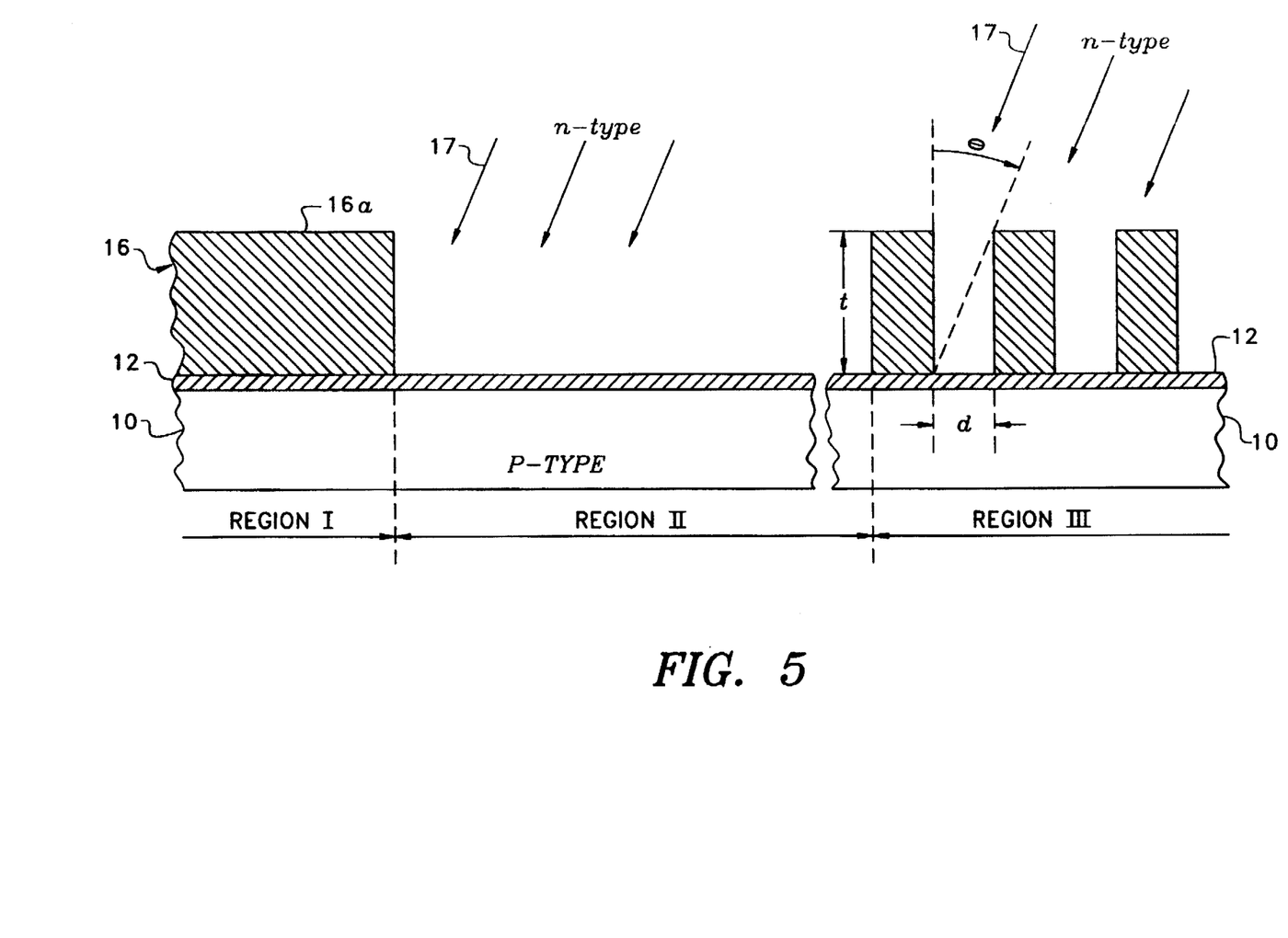
FIG. 5 shows a cross-sectional representation of the method of the present invention for forming both n-channel and p-channel transistors on a single substrate wherein the substrate receives an angled implant.

Referring now to FIG. 5, there is shown a cross-sectional representation of semiconductor substrate 10 wherein an n-type impurity implant is performed at an angle theta. The angled n-type impurity implant is indicated by implant arrows 17. This implant can typically be a n-type implant with a dose of 4e12/cm² at 160 keV. The angled implant is therefore a relatively high energy implant. Thus two n-well implants can be performed using the same photoresist mask 16 in the method of the present invention: a first, relatively low energy, substantially perpendicular implant as indicated by arrows 15, and a second, relatively high energy, angled implant as indicated by arrows 17.

The angled implantation indicated by implant arrows 17 introduces no n-type impurities into Region I of semiconductor substrate 10 because mask portion 16a is disposed over Region I. Thus the angled implant does not interfere with the later formation of a p-well in Region I. The angled implantation indicated by implant arrows 17 does introduce n-type impurities into Region II of semiconductor substrate 10, because Region II is not protected by any portions of photoresist mask 16, as previously described with respect to the implant of arrows 15.

During the angled implant some n-type dopant is introduced into Region III. The concentration of n-type dopant introduced into Region III during the angled implant is determined both by the distance d between mask portions 16b and the angle theta of the implant. The smaller the dimension d of mask portions 16b, the lower the concentration of doping of Region III that occurs due to the angled implant. The concentration of dopant is lower when dimension d is smaller because more surface area of semiconductor substrate 10 is protected by the strips of mask portions 16b.

Additionally, the larger the angle theta of the implant, the lower the concentration of doping of Region III, because less of Region III is shadowed by mask portions 16b, as shown in FIG. 5. When the implant angle theta is greater than arctan(d/t) degrees, Region III below mask portions 16b is completely protected from the angled implant by mask portions 16b. When Region III is completely protected, substantially no impurities are introduced into Region III by the angled implant.

In this manner, the n-type doping of Region III can differ from the n-type doping of Region I without an additional masking step by varying both the value of d and the angle theta of dopant implantation. Therefore, the threshold voltage of transistors later formed within Region I and Region III can differ from each other without an additional masking step by varying dimension d and angle theta. Additionally, the dose and energy of the various n-well implants can be optimized in order to obtain the required channel profiles.

Figure 6:
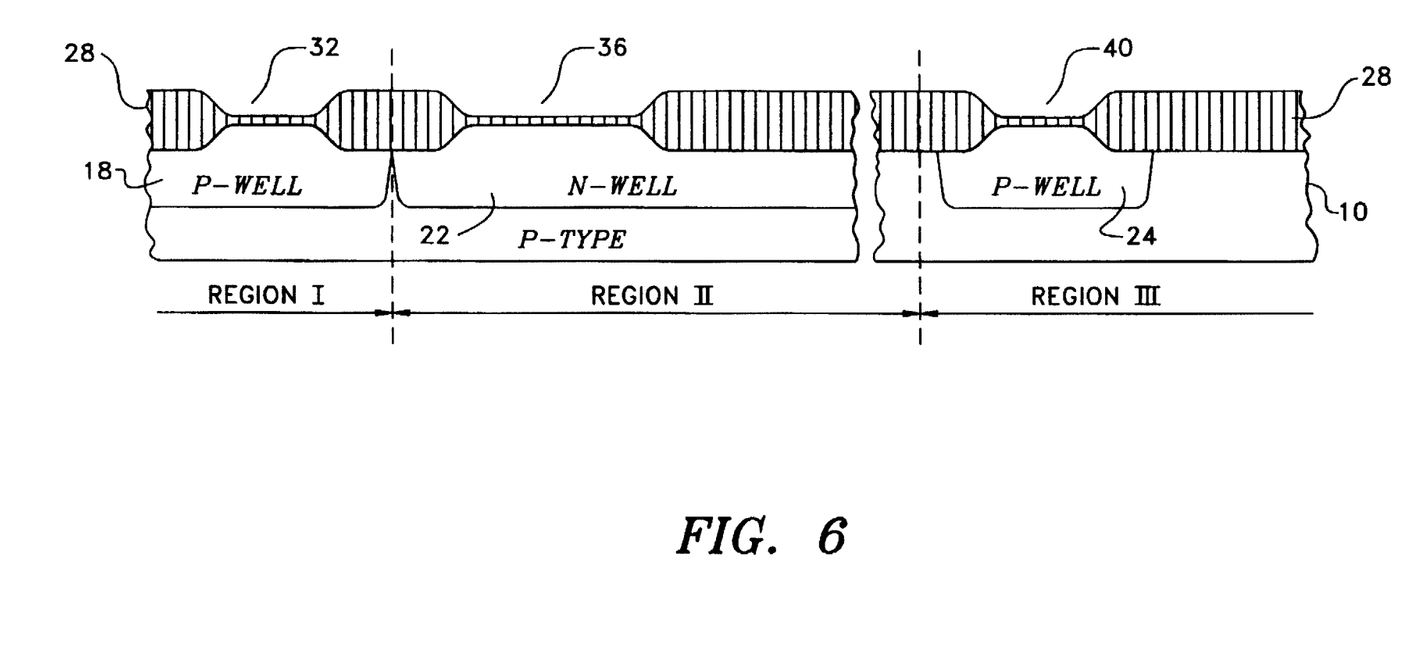
FIG. 6 shows a cross-sectional representation of the method of the present invention for forming both n-channel and p-channel transistors on a single substrate wherein active areas are prepared for transistor formation.

Referring now to FIG. 6, there is shown a cross-sectional representation of p-type semiconductor substrate 10 after the relatively high energy and relatively low energy implants. A well drive step is performed in order to drive the p-well and n-well dopants introduced by the implants farther into semiconductor substrate 10. The well drive step thus forms p-well 18, n-well 22 and p-well 24.

P-well 18 is disposed within Region I which was previously underneath mask portion 16a. The p-well doping of semiconductor substrate 10 that forms p-well 18 is the doping indicated by implant arrows 14. As previously described, the impurity doping of Region I is not affected by the implants indicated by implant arrows 15, 17, because of the presence of mask portion 16a above Region I. P-well 18 is suitable for forming n-channel transistors therein.

Region II of semiconductor substrate 10 contains n-well 22. N-well 22 results from the two n-well implants indicated by implant arrows 15, 17 because Region II is not protected by any portions of photoresist mask 16 during the n-well implants. N-well 22 is suitable for forming p-channel transistors therein.

Region III contains an additional p-well, p-well 24. The surface doping in p-well 24 is more shallow than the doping of p-well 18. As previously described, the reason that there is more n-type doping in p-well 24 than in p-well 18 is that the alternating strips of mask portions 16b do not protect all of Region III from the n-well impurities of the implant indicated by implant arrows 15, 17 while mask portion 16a does protect all of Region I. It will be understood by those skilled in the art that the alternating strips of mask portions 16b can create peaks and valleys in the concentration of dopants within Region III of semiconductor substrate 10. However the well drive step that drives the dopants into semiconductor substrate 10 tends to smear the peaks and valleys of the dopant concentration together and provide a substantially uniform dopant concentration within Region III.

A pad oxide layer of approximately one-hundred twenty angstroms can then be formed over semiconductor substrate 10. A conventional nitride layer of approximately 1500 angstroms is deposited over selected portions of semiconductor substrate 10 in order to define the required active areas. Field oxide layer 28 is grown in accordance with the nitride deposition. Field oxide layer 28 merges with previously formed oxide layer 12. The active areas formed upon semiconductor substrate 10 in this manner are active areas 32, 36, 40. Active areas 32, 36, 40 are suitable for forming transistors thereupon.

A sacrificial oxide layer of approximately two hundred angstroms is formed and an enhancement implant is performed in order to dope active areas. The enhancement implant of the active areas adjusts the threshold voltage of transistors later formed in the active areas 32, 36, 40. The sacrificial oxide layer is then removed.

Figure 7:
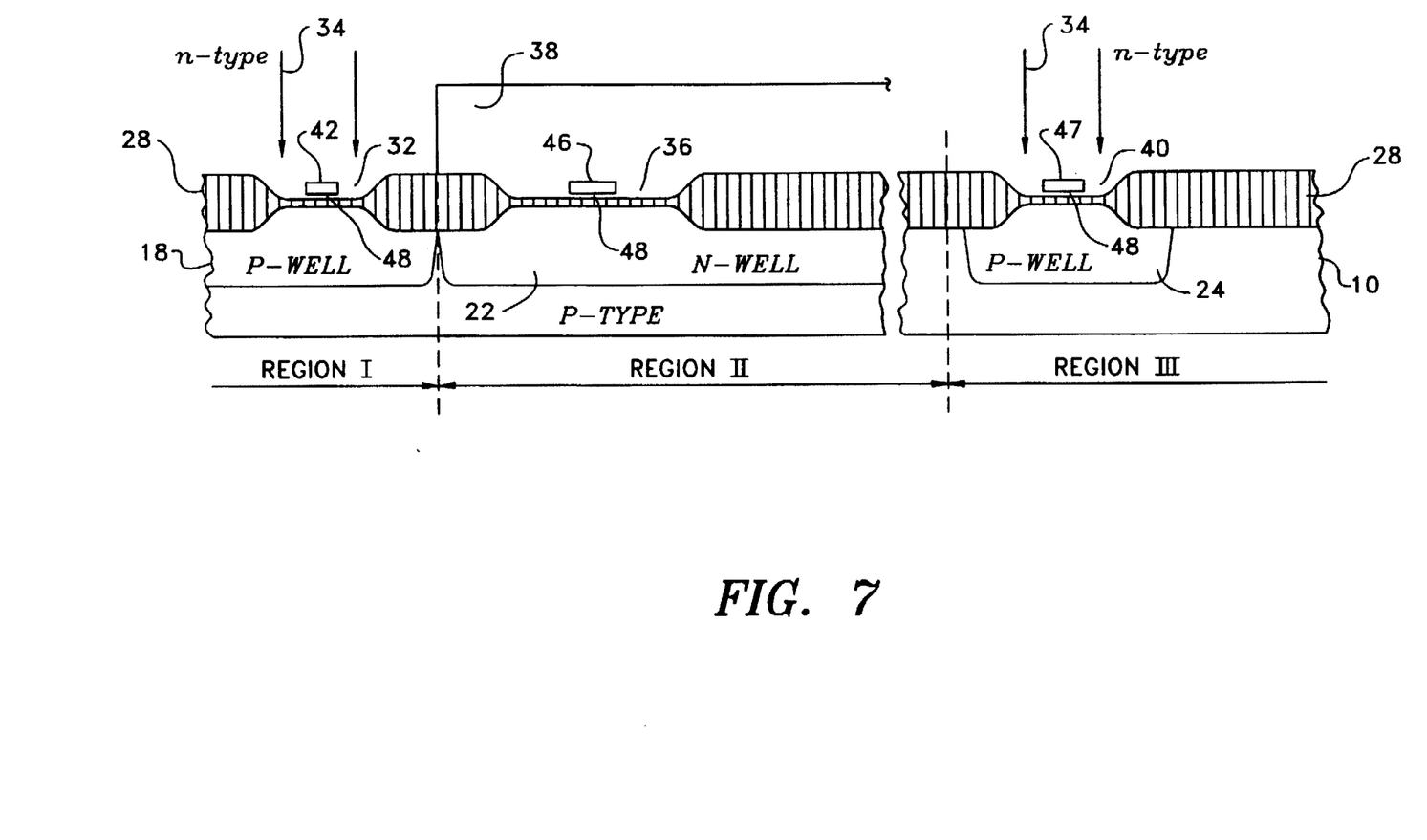
FIG. 7 shows a cross-sectional representation of the method of the present invention for forming both n-channel and p-channel transistors on a single substrate wherein a donor impurity implant is performed to provide the sources and drains of n-channel transistors.

Referring now to FIG. 7, silicon dioxide is formed upon active areas 32, 36, 40 in order to provide gate oxide 48 for the transistors to be formed later thereupon. Gate oxide 48 can be approximately one-hundred angstroms thick. A polysilicon layer is deposited over semiconductor substrate 10 and transistor gates 42, 46, 47 are formed from the polysilicon layer over gate oxide 48. An n-type implant of semiconductor substrate 10 is performed as indicated by implant arrows 34.

Figure 8:
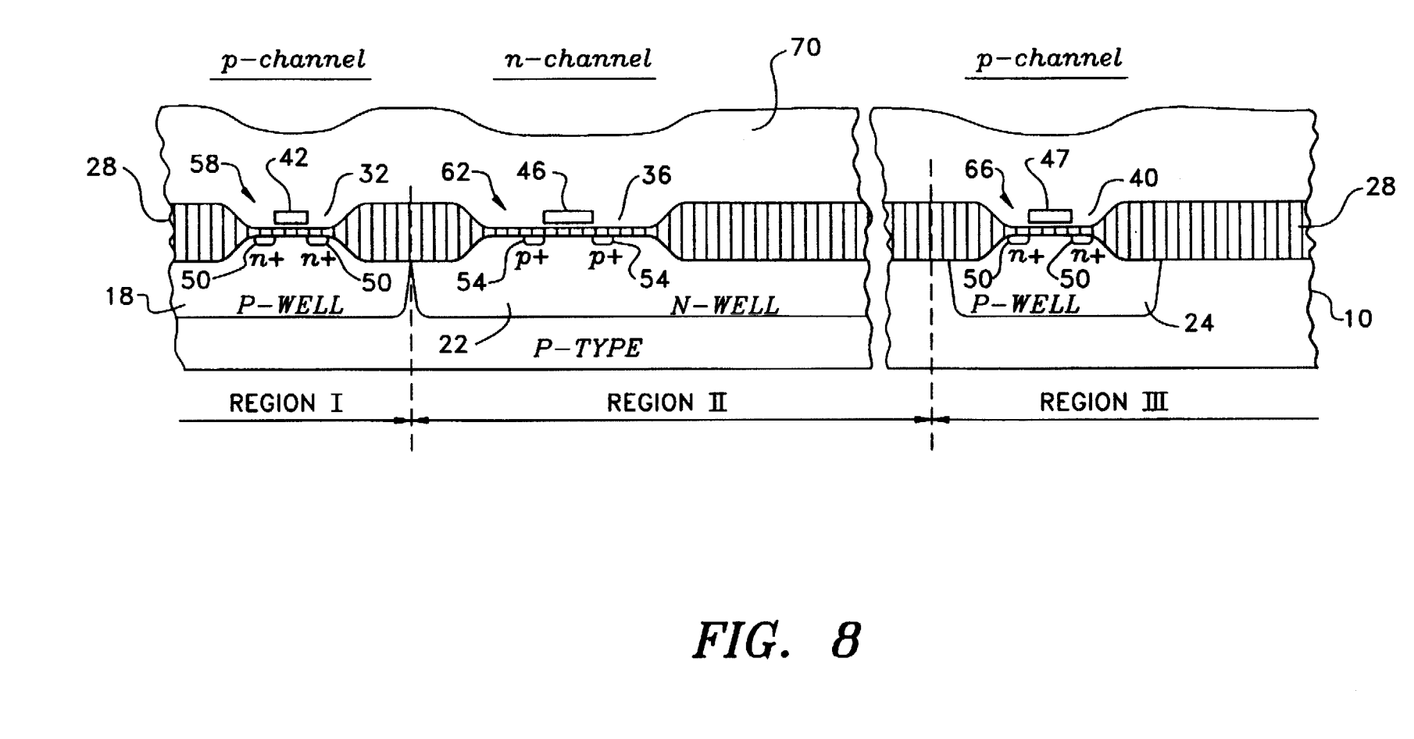
FIG. 8 shows a cross-sectional representation of a passivated semiconductor integrated circuit substrate formed in accordance with the method of the present invention.

Referring now to FIG. 8, source 50 and drain 50 of p-channel transistors 58, 66 are shown. Source 50 and drain 50 are formed in a conventional manner well understood by those skilled in the art by the n-type implant indicated by implant arrows 34, shown in FIG. 7. The n-type impurity implanted in this manner can be arsenic. Active region 36 is protected from the n-type impurity indicated by arrows 34 by mask 38, also shown in FIG. 7.

A channel region is then patterned in active region 36 of Region II and a oxide spacer is formed. A p-type implant is performed in order to form source 54 and drain 54 of n-channel transistor 62. A passivated material such as BPSG material is deposited and reflowed over the entire surface of semiconductor substrate 10 in order to form passivation layer 70. Metal lines can then be deposited and patterned as understood by those skilled in the art.

Thus p-channel transistor 58, n-channel transistor 62 and p-channel transistor 66 are located in active regions 32, 36, 40 respectively. The two p-channel transistors 58, 66 have threshold voltages that differ from each other because of the different amounts of dopants in their channels. The different amounts of dopants in the channels of p-channel transistors 58, 66 are obtained in accordance with the method of the present invention, without additional mask steps beyond the mask steps that would be required to provide a single threshold voltage for both transistors 58, 66 in the prior art. Rapid thermal annealing can be performed to activate the impurities implanted to form transistors 58, 62, 66 in accordance with the method of the present invention.

It is to be understood that although the present invention has been described with reference to a preferred embodiment, various modifications, known to those in the art, can be made to the structures and process steps presented herein. For example, those skilled in the art will understand that the method of the present invention can be used to form n-channel transistors having differing threshold voltages in an n-type substrate as well as in a p-type substrate. Additionally, two p-channel transistors, such as transistors 58, 66 having differing threshold voltages, can be formed in accordance with the method of the present invention without necessarily forming a transistor of the opposite conductivity type simultaneously. Furthermore, it will be understood that the introduction of impurity dopants in the method of the present invention can be by implantation or by diffusion.

We claim:

1. A semiconductor fabrication method for forming a transistor upon a semiconductor substrate, comprising the steps of:
   (a) providing a semiconductor substrate having first, second and third substrate regions;
   (b) forming a single mask layer over said semiconductor substrate, said single mask layer having a first mask portion covering said first substrate region, a second mask portion exposing said second substrate region, and a third mask portion partially covering said third substrate region;
   (c) determining a concentration of a first type impurity;
   (d) selecting an angle for introducing said first type impurity in accordance with said determined concentration;
   (e) differentially introducing at said selected angle said first type impurity dopant into said first, second and third substrate regions in accordance with said single mask layer; and
   (f) forming first, second and third transistors in said first, second and third substrate regions, wherein said first and second transistors have differing conductivity types and said first and third transistors have the same conductivity type and differing threshold voltages in accordance with said differential introducing of said first type impurity dopant.

2. The semiconductor fabrication method of claim 1, wherein said threshold voltages differ from each other in accordance with the percentage of said third substrate region covered by said third mask portion.

3. The semiconductor fabrication method of claim 2, comprising the step of introducing said first type impurity dopant into said third substrate region at said selected angle, wherein said introducing of said first type impurity dopant is partially obstructed in accordance with said selectable angle.

4. The semiconductor fabrication method of claim 3, wherein said selected angle is substantially perpendicular to said semiconductor substrate to provide a dopant concentration in said third substrate region in accordance with the percentage of said third substrate region that is exposed by said third mask portion.

5. The semiconductor fabrication method of claim 1, wherein said third mask portion comprises a plurality of spaced apart strips.

6. The semiconductor fabrication method of claim 5, wherein said threshold voltages differ in accordance with the spacing between said strips.

7. The semiconductor fabrication method of claim 3, wherein said selected angle comprises an angle measured from the perpendicular of said semiconductor substrate for obstructing said first type impurity dopant in accordance with said selected angle to provide a dopant concentration in said third substrate region in accordance with said selected angle.

8. The semiconductor fabrication method of claim 7, wherein said third mask portion comprises a plurality of spaced apart strips having a distance d between the strips and a height t and said introducing of said first type dopant impurity is substantially obstructed at angles greater than arctan (d/t).

9. The semiconductor fabrication method of claim 1, wherein said introducing comprises a dopant implant.

10. The semiconductor fabrication method of claim 1, wherein said introducing comprises a dopant diffusion.

11. The semiconductor fabrication method of claim 1, comprising the additional step of performing a blanket implant of an impurity having a second type impurity dopant over said semiconductor substrate prior to step (b).

* * * * *